(12) United States Patent
Patil et al.

(10) Patent No.: US 8,456,140 B2
(45) Date of Patent: Jun. 4, 2013

(54) POWER CONTROL APPARATUS AND METHOD FOR CONTROLLING A SUPPLY VOLTAGE FOR AN ASSOCIATED CIRCUIT

(75) Inventors: Sanjay Bhagwan Patil, Austin, TX (US); Marlin Wayne Frederick, Jr., Austin, TX (US); Valentina Gomez, Austin, TX (US)

(73) Assignee: ARM Limited, Cambridge (GB)

( * ) Notice: Subject to any disclaimer, the term of this patent is extended or adjusted under 35 U.S.C. 154(b) by 352 days.

(21) Appl. No.: 12/805,146

(22) Filed: Jul. 14, 2010

(65) Prior Publication Data

US 2012/0013319 A1 Jan. 19, 2012

(51) Int. Cl.
*G05F 1/00* (2006.01)

(52) U.S. Cl.
USPC .......................................... 323/222; 323/28.2

(58) Field of Classification Search
USPC .................................. 323/222, 282
See application file for complete search history.

(56) References Cited

U.S. PATENT DOCUMENTS

| | | | |
|---|---|---|---|
| 5,030,858 A | 7/1991 | Sekiya | |
| 5,124,595 A | 6/1992 | Mandelcorn | |
| 5,440,277 A | 8/1995 | Ewen et al. | |
| 5,625,323 A | 4/1997 | Tozawa | |
| 5,821,769 A | 10/1998 | Douseki | |
| 6,043,711 A | 3/2000 | Kim | |
| 6,233,128 B1 | 5/2001 | Spencer et al. | |
| 7,109,784 B2 | 9/2006 | Anthony et al. | |
| 7,164,301 B2 | 1/2007 | Chun | |
| 7,190,187 B2 | 3/2007 | Hua et al. | |
| 7,486,108 B2* | 2/2009 | Kim et al. | 326/34 |
| 7,643,357 B2* | 1/2010 | Braceras et al. | 365/189.09 |
| 2006/0232321 A1 | 10/2006 | Chuang et al. | |
| 2008/0191971 A1* | 8/2008 | Kim et al. | 345/60 |
| 2008/0272652 A1 | 11/2008 | Idgunji et al. | |
| 2009/0189636 A1 | 7/2009 | Amedeo et al. | |
| 2009/0256608 A1 | 10/2009 | Djaja et al. | |

OTHER PUBLICATIONS

C. Hua et al, "Distributed Data-Retention Power Gating Techniques for Column and Row Co-Controlled Embedded SRAM" Proceedings of the 2005 IEEE International Workshop on Memory Technology, Design, and Testing, 2005, 6 pages.

Z. Zhang et al, "Active Leakage Control with Sleep Transistors and Body Bias" Symposium on Low Power Electronics and Design, 2005, pp. 1-6.

(Continued)

*Primary Examiner* — Adolf Berhane
*Assistant Examiner* — Emily Pham
(74) *Attorney, Agent, or Firm* — Nixon & Vanderhye P.C.

(57) ABSTRACT

A power control apparatus for controlling a supply voltage for an associated circuit comprises a power input for receiving an input voltage and a power output for supplying the supply voltage to the circuit. A switch device is provided with a first terminal coupled to the power input, a second terminal coupled to the power output and a control terminal for receiving a sleep select signal. A control device selectively configures the switch device to act as either a power gating switch, in which the switch device is responsive to the sleep select signal to select whether or not to supply the input voltage to the power output; or a retention switch in which a voltage difference is formed between the power input and the power input and the switch device supplies a retention voltage to the power output, the retention voltage being different to the input voltage.

20 Claims, 8 Drawing Sheets

OTHER PUBLICATIONS

C. Hua et al, "A Power Gating Structure With Concurrent Data Retention and Intermediate Modes in 100NM Technology" 2005, 4 pages.

B. Bai et al, "Fault Modeling and Testing of Retention Flip-Flops in Low Power Designs" IEEE, Proceedings of the 2009 Asia and South Pacific Design Automation Conference, 2009, pp. 684-689.

K. Shi et al, "Challenges in Sleep Transistor Design and Implementation in Low-Power Designs" Proceedings of the $43^{rd}$ Annual Design Automation Conference, 2006, pp. 113-116.

P.R. van der Meer et al, "New standby-current reduction technique for deep sub-micron VLSI CMOS circuits: Smart Series Switch" ESSCIRC 2002, Proceedings of the $28^{th}$ European Solid-State Circuits Conference, 2002, pp. 663-666.

J. Kao et al, "Transistor Sizing Issues and Tool for Multi-Threshold CMOS Technology" Proceedings of the $34^{th}$ annual Design Automation Conference, ACM, 1997, pp. 409-414.

A. Agarwal et al, "DRG-Cache: A Data Retention Gated-Ground Cache for Low Power" IEEE, Proceedings of the $39^{th}$ Design Automation Conference, 2002, 6 pages.

H. Kim et al, "Physical Design Methodology of Power Gating Circuits for Standard-Cell-Based Design" Proceedings of the $43^{rd}$ annual Design Automation Conference, 2006, pp. 109-112.

H. Mahmoodi-Meimand et al, "Data-Retention Flip-Flops for Power-Down Applications" IEEE, 2004, Proceedings of the 2004 International Symposium on Circuits and Systems, vol. 2, pp. II-677 to II-680.

S. Mutoh et al, "1-V Power Supply High-Speed Digital Circuit Technology with Multithreshold-Voltage CMOS" IEEE Journal of Solid-State Circuits, vol. 30, No. 8, Aug. 1995, pp. 847-854.

\* cited by examiner

| | nRET | nSLEEP | Gt | VDD |
|---|---|---|---|---|
| Active (power up) | 1 | 0 | 0 | → VDDG |
| Retention | 0 | X | → VDDG−$|V_{tp}|$−dV | → VDDG−$|V_{tp}|$−dV |
| Sleep (power down) | 1 | 1 | 1 | → ground |

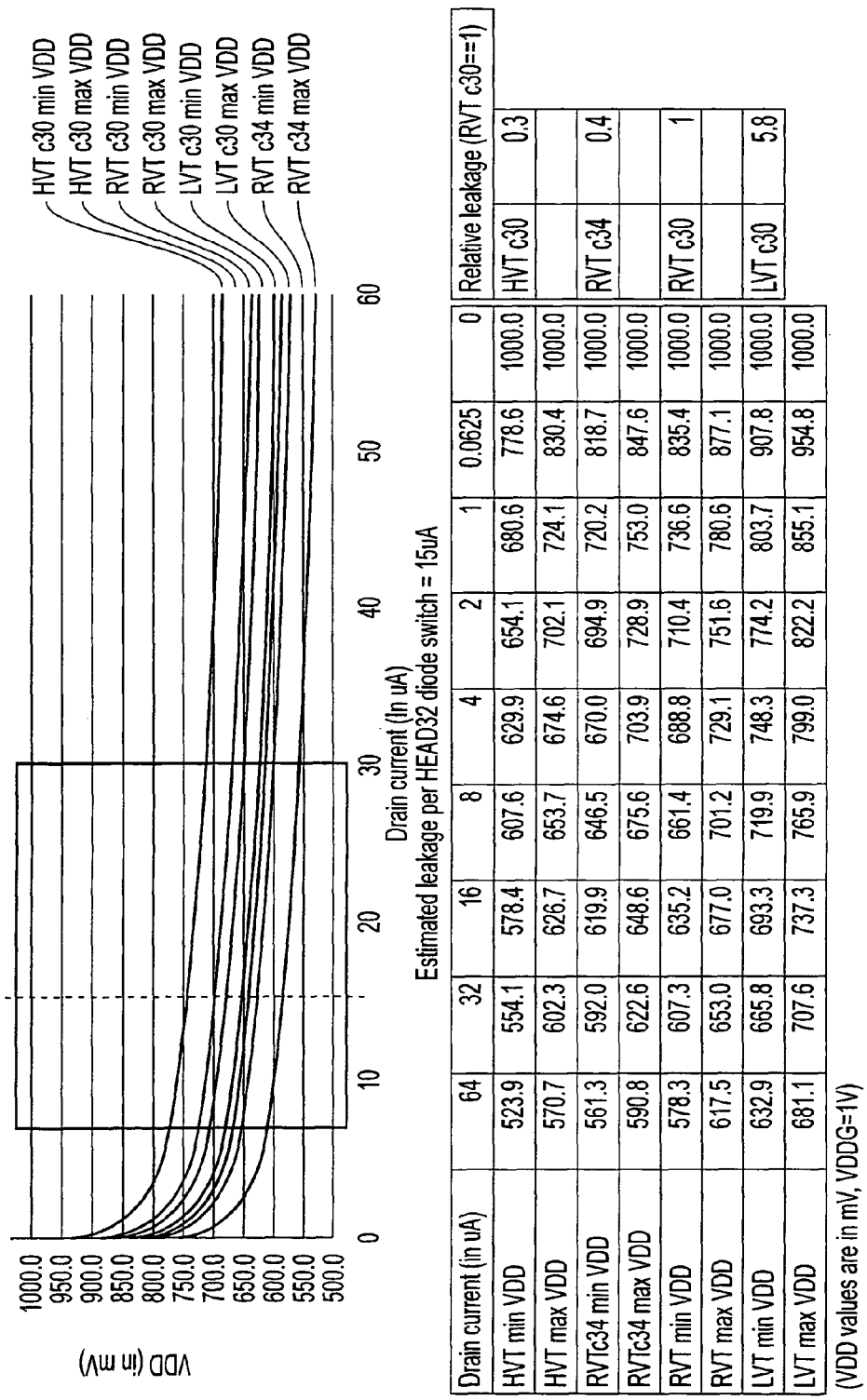
FIG. 6 CONTINUED FROM PAGE 5/8

| | nRET | nSLEEP | Gt | VSS |
|---|---|---|---|---|
| Active (power up) | 0 | 1 | 1 | VSSG |
| Retention | 1 | X | $VSSG+V_{tn}+dV$ | $VSSG+V_{tn}+dV$ |
| Sleep (power down) | 0 | 0 | 0 | Ground |

POWER CONTROL APPARATUS AND METHOD FOR CONTROLLING A SUPPLY VOLTAGE FOR AN ASSOCIATED CIRCUIT

FIELD OF THE INVENTION

The present invention relates to the field of data processing. More particularly, the invention relates to a power control apparatus for controlling a supply voltage for an associated circuit.

BACKGROUND OF THE INVENTION

A processing circuit may have one or more power saving states for use when the processing hardware is inactive. One example of such a low power state can be provided by the use of a power gating transistor connected in series with the processing circuit. The power gating transistor turns the power supply to the processing circuit on or off. When the power gating transistor is on then the full supply voltage is provided to the processing circuit, while when the power gating transistor is switched off then the power supply is shut off from the processing circuit and any state in the processing circuit is lost.

Another power saving scheme may be provided by a retention switch for supplying the processing circuit with a retention voltage which is different to the supply voltage and results in lower current leakage in the processing circuit but is nevertheless sufficient for the processing circuit to maintain state in its flip flops and latches.

In previously known apparatuses, a processing circuit may be provided with a power gating switch and a retention switch separate from the power gating switch. The power gating switch may be used to switch on and off the power supply to the processing circuit, while the retention switch may be used to supply a retention voltage to the processing circuit. Typically a processing circuit requires many thousands of such switches and so the power gating and retention switches occupy a large proportion of the circuit area of the apparatus. For example, the switches may occupy between 10 and 30% of the entire area of the chip. Moreover, the power switches contribute to a significant amount of static leakage. The present invention seeks to reduce the overhead associated with providing different power saving modes.

SUMMARY OF THE INVENTION

Viewed from one aspect the present invention provides a power control apparatus a power control apparatus for controlling a supply voltage for an associated circuit, comprising:

a power input for receiving an input voltage;

a power output for supplying said supply voltage to said associated circuit;

a switch device comprising a first terminal coupled to said power input, a second terminal coupled to said power output, and a control terminal for receiving a sleep select signal;

a control device for selectively connecting said second terminal of said switch device to said control terminal of said switch device; wherein when said second terminal and said control terminal are not connected by said control device, said switch device is responsive to said sleep select signal to select whether or not to supply said input voltage to said power output; and when said second terminal and said control terminal are connected by said control device, a voltage difference is formed between said power input and said power output and said switch device supplies a retention voltage to said power output, said retention voltage being different to said input voltage.

The present technique recognises that power gating modes, wherein a circuit associated with a power control apparatus is selectively supplied or not supplied with an input voltage, and a retention mode, wherein the associated circuit is supplied with a retention voltage level that is different to the input voltage, are mutually exclusive. That is, at any given instance the same circuit hardware is either powered up or powered down according to the power gating modes or is supplied with the retention voltage in retention mode. Therefore, the present technique recognises that the processing overhead associated with providing separate retention switches and power gating switches as in the previously known systems may be avoided and the area cost of, and leakage power consumed by, the power control apparatus may be reduced by providing a switch device which can control both the power gating modes and the retention mode.

Thus, the present technique provides a power control apparatus comprising a power input for receiving an input voltage and a power output for supplying a supply voltage to an associated circuit. The associated circuit may be any part of a data processing apparatus, such as a processor, memory, cache, or memory controller, for example. A switch device is provided comprising a first terminal coupled to the power input, a second terminal coupled to the power output, and a control terminal for receiving a sleep select signal.

A control device may be provided for selectively connecting the second terminal of the switch device to the control terminal of the switch device. When the second terminal and the control terminal of the switch device are not connected by the control device, then the switch device is responsive to the sleep select signal to select whether or not to supply the input voltage to the power output and hence supply the input voltage to the associated circuit. Thus, when the second terminal and control terminal are not connected, the switch device behaves as a power gating switch which can turn on or off the input voltage to the associated circuit in response to the sleep select signal.

When the second terminal and the control terminal of the switch device are connected by the control device, then a voltage difference is formed between the power input and the power output so that the switch device applies a retention voltage to the power output, the retention voltage being different to the input voltage. Thus, when the second terminal and control terminal are connected then the switch device behaves as a retention switch for switching in a retention voltage to the associated circuit.

Hence, the control device can dynamically reconfigure the switch device as either a power gating switch or a retention switch. By providing a single switch having both these functions, the circuit area associated with the power control apparatus may be reduced in comparison to a system having separate power gating and retention switches, and the static leakage associated with the power control apparatus may be reduced.

The switch device may have a plurality of operating modes including:

(i) an active mode in which said second terminal and said control terminal are not connected by said control device and said sleep select signal controls said switch device to supply said input voltage to said power output;

(ii) a sleep mode in which said second terminal and said control terminal are not connected by said control device and said sleep select signal controls said switch device to isolate said power output from said input voltage;

(iii) a retention mode in which said second terminal and said control terminal are connected by said control device and said switch device supplies said retention voltage to said power output.

The power control apparatus has different modes for controlling the power supply to the associated circuit. In an active mode, the switch device is controlled by the control device to supply the input voltage to the power outputs and on to the associated circuit. The active mode may be used when the processing circuit is actively performing processing or memory operations, for example. In a sleep mode, the switch device is controlled to isolate the power output from the input voltage, so that the processing circuit may be turned off to save power. The active and sleep modes may collectively be referred to as power gating modes.

In a retention mode, the control device connects the second terminal and the control terminal of the switch device so that the switch device supplies the retention voltage to the power output. The retention mode can be used when the associated circuit is not currently active to reduce power leakage while the processing state is still retained. The sleep select signal and the control device together control the current operating mode of the switch device.

The power control apparatus may comprise a tri-state buffer coupled to the control terminal of the switch device and configured to;

isolate said control terminal of said switch device from said sleep select signal when said second terminal is connected to said control terminal by said control device; and allow said sleep select signal to be supplied to said control terminal of said switch device when said second terminal is not connected to said control terminal by said control device.

The tri-state buffer and control device may operate in a mutually exclusive manner so that one of the tri-state buffer and control device is conductive at any time. When the second terminal and control terminal of the switch device are not connected by the control device, then the tri-state buffer allows the sleep select signal to be supplied to the control terminal of the switch device to control whether the switch device is in the active mode or the sleep mode. In contrast, when the second terminal and control terminal of the switch device are connected together by the control device then the switch device becomes responsive to the voltage output from the second terminal and so, to prevent the sleep select signal affecting the operation of the switch device, the tri-state buffer may isolate the control terminal of the switch device from the sleep select signal. The mutually exclusive operation of the tri-state buffer and control device prevents a short circuit current path forming between the power input and the power output via the tri-state buffer and control device.

The control device may be responsive to a retention select signal to select whether the second terminal is connected to the control terminal, and the tri-state buffer may be responsive to the retention select signal to select whether to allow the sleep select signal to be supplied to the control terminal of the switch device.

By controlling the tri-state buffer and the control device using the same retention select signal, it is ensured that the tri-state buffer and control device will switch states simultaneously so that the switch device is always in a definite one of the active, retention and sleep modes. When transitioning from one mode to another, the switch device moves directly between modes with no "dead zones" where the switch device is in an indefinite state. Hence, the likelihood of state corruption in the associated circuit may be reduced.

When the second terminal and the control terminal of the switch device are connected by the control device, the voltage difference between the power input and the power output may be dependent on a threshold voltage of the switch device.

Connecting the second terminal and the control terminal of the switch device reconfigures the switch device as a diode connected device. This causes the signal at the second terminal and control terminals to settle to a value dependent on the threshold voltage, and causes a voltage difference across the switch device that is dependent on the threshold voltage. Accordingly, a retention voltage which differs from the input voltage may be formed at the power output and provided to the processing circuit.

The power control apparatus may be a header circuit. Thus, the power control apparatus may be provided between the main supply rail and a virtual supply rail for the associated circuit so that the power control apparatus regulates the voltage level provided on the virtual supply rail.

While n-type header circuits may be provided, typically the switch device of the header circuit is a p-type transistor.

In the header circuit, the retention voltage may be lower than the input voltage. In this case, the voltage difference across the switch device during the retention mode is a voltage drop.

The power control apparatus may be a footer circuit. For example, the footer circuit may be provided between the main ground supply rail and a virtual ground supply rail of the associated circuit so that the footer circuit regulates the ground supply level supplied to the associated circuit over the virtual ground supply rail.

While p-type embodiments of a footer device may be devised by the skilled person, typically the switch device of the footer circuit is an n-type transistor.

In the footer device, the retention voltage may be higher than the input voltage. Thus, in the footer device the voltage difference across the switch device is a voltage increase.

Viewed from another aspect, the present invention provides a data processing apparatus comprising:

an associated circuit; and at least one power control apparatus as described above for controlling a supply voltage for said processing circuit.

An associated circuit such as a processor or a memory may be provided with at least one power control apparatus of the type mentioned above for controlling a supply voltage for the processing circuit. When implemented as part of a data processing apparatus, the power control apparatus described above can reduce the circuit area and static leakage overhead associated with power control by approximately 50%, because a single switch device provides the power gating and retention functions which were previously provided using two separate switching devices.

In the data processing apparatus, when the retention voltage is supplied to the associated circuit by the at least one power control apparatus, a voltage difference across the associated circuit may be smaller than when the input voltage is supplied to the associated circuit by the at least one power control apparatus.

If the power control apparatus is a header circuit, for example, then by reducing the power supply over the main power supply rail the voltage difference across the associated circuit becomes smaller and so static leakage is reduced. Similarly, if the power control apparatus is a footer device, then the ground supply voltage supplied to the associated circuit may be increased in the retention mode relative to the active mode, thus reducing the voltage difference across the associated circuit.

The data processing apparatus may comprise a plurality of said power control apparatuses; and a sleep select supply network for supplying said sleep select signal to said plurality of power control apparatuses;

wherein said sleep select supply network comprises at least one delaying element for delaying said sleep select signal for one of said power control apparatuses relative to said sleep select signal for another of said power control apparatuses.

A data processing apparatus may typically comprise a plurality of power control apparatuses for supplying power to the associated circuit. When the sleep select signal controls a transition between the sleep (power off) mode and the active (power on) mode, if all of the plurality of power control apparatuses were switched at the same time then this may draw a significant amount of in-rush current through the power control apparatuses, which may cause a momentary drop in the voltage difference across the associated circuit. This could affect the proper operation of the associated circuit. To avoid a large in-rush current, a sleep select supply network may be provided for supplying the power control apparatuses with the sleep select signal which controls the transition between the sleep mode and active mode. The sleep select supply network may comprise at least one delaying element for delaying the sleep select signal for one of the power control apparatuses relative to the sleep select signal for another of the power control apparatuses. By staggering the distribution of the sleep select supply signal to the various power control apparatuses in this way, the in-rush current generated on switching between the sleep mode and the active mode may be reduced.

The control device may be responsive to a retention select signal to select whether said second terminal is connected to said control terminal; and said data processing apparatus may comprise a plurality of said power control apparatuses and a retention select supply network for supplying said retention select signal to said plurality of power control apparatuses;

wherein said retention select supply network comprises at least one delaying element for delaying said retention select signal for one of said power control apparatuses relative to said retention select signal for another of said power control apparatuses.

In a similar way to the transition between the sleep and active modes, on a transition between the retention mode and the active mode, an in-rush current may arise in the processing apparatus. Therefore, a retention select supply network may be provided for distributing the retention select signal to the various power control apparatuses with respective delays between the different power control apparatuses, in a similar way to the sleep select signal supply network described above.

In the sleep select supply network and retention select supply network, the delaying elements may comprise any circuit element that provides a signal propagation delay. For example, the delaying elements may comprise buffers, wires, or gates. The delaying elements may be provided between the respective power control apparatuses. Also, elements within the power control apparatuses themselves may provide a delay. For example, the tri-state buffer provided in certain embodiments of the power control circuit may have an inherent delay associated with it. This can be useful since the larger the delay provided by components of the power control circuit itself, the fewer delaying elements are required between the power control circuits, and hence the lower the overall gate count of the processing apparatus.

The retention select supply network may comprise a chain of said delaying elements for delaying said retention select signals for respective power control apparatuses by respective delay amounts;

said chain of delaying elements comprising a start input for inputting said retention select signal at a start of said chain and a by pass input for inputting said retention select signal at an intermediate point of said chain;

wherein said retention select signal is input at said bypass input when said switch devices of said power control apparatuses transition from supplying said retention voltage to supplying said input voltage.

Typically, the retention select supply network comprises a chain of delaying elements so that when the retention select signal is input at the start of the chain, the retention select signal then trickles through the chain and is input to the respective power control apparatuses at respective points across the chain. However, it can be useful to provide a bypass input whereby the retention select signal can be input at an intermediate point of the chain, for use on transitions from the retention mode (supplying the retention voltage) to the active mode (supplying the input voltage). This is because the voltage difference between the retention voltage and the input voltage is smaller than the voltage difference between the sleep supply voltage and the input voltage and so the transition from retention mode to active mode does not generate as large an in-rush current as the transition from sleep mode to active mode. Therefore, the full chain for the retention select supply network is not required on transition from the retention mode to the active mode and so the retention select signal can be input at an intermediate point of the chain to reduce the latency associated with the mode switch. The bypass input at an intermediate point of the chain need not be exactly half way along the chain and may be any point of the chain that is not at the beginning.

Viewed from another aspect, the present invention provides a power control apparatus for controlling a supply voltage for an associated circuit, comprising:

power input means for receiving an input voltage;

power output means for supplying said supply voltage to said associated circuit;

switch means for switching said supply voltage, comprising a first terminal means for coupling to said power input means, a second terminal means for coupling to said power output means, and a control terminal means for receiving a sleep select signal;

control means for selectively connecting said second terminal means of said switch means to said control terminal means of said switch means; wherein when said second terminal means and said control terminal means are not connected by said control means, said switch means is responsive to said sleep select signal to select whether or not to supply said input voltage to said power output means; and when said second terminal means and said control terminal means are connected by said control means, a voltage difference is formed between said power input means and said power output means and said switch means supplies a retention voltage to said power output means, said retention voltage being different to said input voltage.

Viewed from a further aspect, the present invention provides a method of controlling a supply voltage for an associated circuit using a switch device comprising a control terminal, a first terminal coupled to a power input and a second terminal coupled to a power output for supplying said supply voltage to said associated circuit, said method comprising:

receiving an input voltage at said power input;

selectively connecting said second terminal of said switch device to said control terminal of said switch device;

when said second terminal and said control terminal are not connected, selecting whether or not to supply said input voltage to said power output in dependence on a sleep select signal received at said control terminal;

when said second terminal and said control terminal are connected, forming a voltage difference between said power input and said power output and supplying a retention voltage to said power output, said retention voltage being different to said input voltage.

Viewed from a further aspect, the present invention provides a power control apparatus for controlling a supply voltage for an associated circuit, comprising:

a power input for receiving an input voltage;

a power output for supplying said supply voltage to said associated circuit;

a switch device for controlling said supply voltage, comprising a first terminal coupled to said power input, a second terminal coupled to said power output, and a control terminal for receiving a control signal; wherein:

said switch device is responsive to said control signal having a first voltage level to operate in an active mode in which said switch device supplies said input voltage to said power output;

said switch device is responsive to said control signal having a second voltage level to operate in a retention mode in which a voltage difference is formed between said power input and said power output and said switch device supplies a retention voltage to said power output, said retention voltage being different to said input voltage; and said switch device is responsive to said control signal having a third voltage level to operate in a sleep mode in which said switch device isolates said power output from said input voltage.

The switch device has a first terminal and a second terminal which are located between the power input and the power output of the control apparatus. The switch device also has a control terminal for receiving a control signal which controls the mode of the switch device. The control terminal of the switch device is responsive to three different voltage levels of the control signal to select the current operating mode of the switch device. A first voltage level controls the switch device to operate in an active mode in which the switch device couples the power input and power output so that the input voltage is supplied to the power output and on to the associated circuit. A second voltage level of the control signal controls the switch device to operate in a retention mode where a voltage difference is formed between the power input and power output and a retention voltage different to the input voltage is supplied to the power output. A third voltage level controls the switch device to operate in a sleep mode in which the switch device isolates the power output from the input voltage so that the associated circuit can be switched off. By controlling the voltage level of the control signal, the switch device can transition between the active mode, retention mode and sleep mode as desired. Hence, the switch device provides an efficient way of controlling the voltage supply to an associated circuit.

Viewed from a further aspect, the present invention provides a power control apparatus for controlling a supply voltage for an associated circuit, comprising:

power input means for receiving an input voltage;

power output means for supplying said supply voltage to said associated circuit;

switch means for controlling said supply voltage, comprising a first terminal means for coupling to said power input means, a second terminal means for coupling to said power output means, and a control terminal means for receiving a control signal; wherein:

said switch device means is responsive to said control signal having a first voltage level to operate in an active mode in which said switch device means supplies said input voltage to said power output means;

said switch device means is responsive to said control signal having a second voltage level to operate in a retention mode in which a voltage difference is formed between said power input means and said power output means and said switch device supplies a retention voltage to said power output means, said retention voltage being different to said input voltage; and said switch device means is responsive to said control signal having a third voltage level to operate in a sleep mode in which said switch device means isolates said power output means from said input voltage.

Viewed from another aspect, the present invention provides a method of controlling a supply voltage for an associated circuit using a switch device comprising a control terminal, a first terminal coupled to a power input, and a second terminal coupled to a power output for supplying said supply voltage to said associated circuit; said method comprising:

receiving an input voltage at said first terminal;

receiving a control signal at said control terminal;

when said control signal has a first voltage level, operating said switch device in an active mode in which said switch device supplies said input voltage to said power output;

when said control signal has a second voltage level, operating said switch device in a retention mode in which a voltage difference is formed between said power input and said power output and said switch device supplies a retention voltage to said power output, said retention voltage being different to said input voltage; and when said control signal has a third voltage level, operating said switch device in a sleep mode in which said switch device isolates said power output from said input voltage.

The above, and other objects, features and advantages of this invention will be apparent from the following detailed description of illustrative embodiments which is to be read in connection with the accompanying drawings.

DESCRIPTION OF THE PREFERRED EMBODIMENTS

Figures 1, 2:
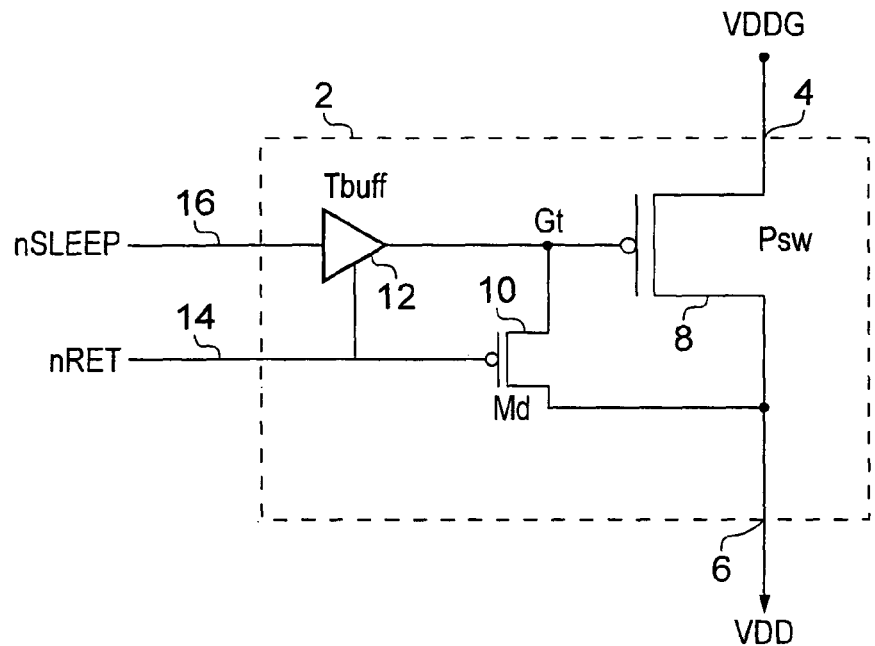
FIG. 1 schematically illustrates a power control apparatus for controlling a main supply voltage of a processing circuit.
FIG. 2 illustrates example control signals for controlling the operating mode of the power control apparatus of FIG. 1.

FIG. 1 schematically illustrates a power control apparatus 2 for controlling the power supply to an associated circuit. The associated circuit may be, for example, a processor, memory device, memory controller, or any other element of a processing apparatus, but in the example embodiments described below shall be a processing circuit. The apparatus 2 has a power input 4 for receiving an input voltage level VDDG and a power output 6 for outputting a supply voltage VDD to the processing circuit. In this example, the apparatus 2 is a header circuit for controlling the main supply voltage of the processing circuit and so the power input 4 receives a high voltage level.

The power control apparatus 2 comprises a switch device 8, a control device 10 and a tri-state buffer 12. The switch device 8 is a p-type transistor coupled between the power input 4 and the power output 6. The switch device 8 regulates the voltage level supplied to the power output 6. The switch device 8 has three terminals; a source terminal coupled to the power input 4, a drain terminal coupled to the power output 6 and a gate (control) terminal for receiving a control signal.

The control device 10 is a p-type transistor coupled between the drain and source of the switch device 8. The control device 10 receives a retention select signal 14 and controls whether the switch device 8 operates as a power gating switch or as a retention switch. The tri-state buffer 12 is coupled to the gate of the switch device 8 and controls transitions between an active mode and a sleep mode when the switch device 8 is behaving as a power gating switch. The tri-state buffer 12 receives a sleep select signal 16 for controlling transitions between the sleep and active modes.

FIG. 2 illustrates a table showing how the switch device 8 can be placed in an active mode for supplying the full input voltage VDDG to the processing circuit, a retention mode for supplying a retention voltage VDDG−|Vtp|−dV to the processing circuit and a sleep mode for isolating the processing circuit from the voltage supply. The active and sleep modes may collectively be referred to as power gating modes. The retention select signal 14 and sleep select signal 16 collectively determine the value of a control signal at a signal node Gt of the header circuit 2. The control signal at node Gt is applied to the control terminal of the switch device 8 to select the operating mode of the switch device.

In the active mode, the retention select signal 14 is high and so the control device 10 is off, disconnecting the drain and gate terminals of the switch device 8. The retention select signal 14 controls the tri-state buffer 12 to be conductive so as to allow the sleep select signal 16 to be supplied to the gate terminal of the switch device 8 via signal node Gt. The sleep select signal 16 has a low value and so the switch device 8 is on, thus coupling the power input 4 to the power output 6 and resulting in the full input power level VDDG being supplied via the power output 6 to the processing circuit. Since full power is supplied to the processing circuit, any state stored in latches or flip-flops of the processing circuit is retained.

In the sleep mode, the retention select signal 14 has a high logic level, and so the control device 10 is off and the drain and gate of the switch device 8 are not connected. In the sleep mode, the sleep select signal has a high value which is supplied to the gate of the switch device 8 via the tri-state buffer 12 and signal node Gt to turn the switch device 8 off. Therefore, the switch device 8 isolates the power output 6 from the input voltage VDDG at the power input 4. Thus, the power output 6 discharges to a ground voltage level and so the processing circuit is isolated from the power supply. Any state stored in flip-flops or latches within the processing circuit 4 is lost.

In the retention mode, the retention enable signal 14 is switched to a low value. This causes the tri-state buffer 12 to be placed in a high impedance state so that the gate of the switch device 8 is isolated from the sleep select signal 16. Thus, the switch device 8 is not responsive to the sleep select signal 16 in the retention state. At the same time, the control device 10 is turned on which couples the drain and gate terminals of the switch device 8 so that the switch device 8 is placed in a diode connected state. This causes the signals at the drain and gate of the switch device 8 to settle to a retention voltage VDDG−|Vtp|−dV, where Vtp is the threshold voltage of the switch device 8 (note that for a PMOS transistor, the threshold voltage is a negative voltage, but in equations the threshold voltage will be written as an absolute voltage |Vtp|), and dV is the gate over drive beyond Vtp that is needed for the switch device 8 to supply enough current to match the static leakage current drawn by the associated circuit during the retention mode (see the description of FIG. 3 below). The retention voltage is lower than the input voltage and is supplied via the power output 6 to the processing circuit. The retention voltage enables the static leakage in the processing circuit to be reduced relative to the active mode but is still sufficient to retain any processing state within the processing circuit.

Hence, the control device 10 selectively places the switch device 8 in a diode connected or non-diode connected state according to whether the retention mode or one of the power gating (active or sleep) modes is desired.

The tri-state buffer 12 and control device 10 are mutually exclusive so that when the tri-state buffer allows the sleep select signal 16 to pass to the switch device 8, the control device 10 is off; while when the tri-state buffer 12 is in the high impedance state, the control device 10 is on. This is useful because a short circuit path could otherwise arise between the power input 4 and power output 6 via the tri-state buffer's power supply (although not illustrated, the tri-state buffer may be powered from the same source as the VDDG power input 4), the tri-state buffer 12, the signal node Gt, and the control device 10. The short circuit path is blocked by arranging for one of the tri-state buffer 12 and control device 10 to be non-conductive at any time.

Also, by configuring both the tri-state buffer 12 and the control device 10 with the same retention select signal 14, the switch device 8 is in a definite one of the active, or retention or sleep states and cannot be placed in an indefinite state. This reduces the likelihood of state corruption within the processing circuit.

Figure 3:
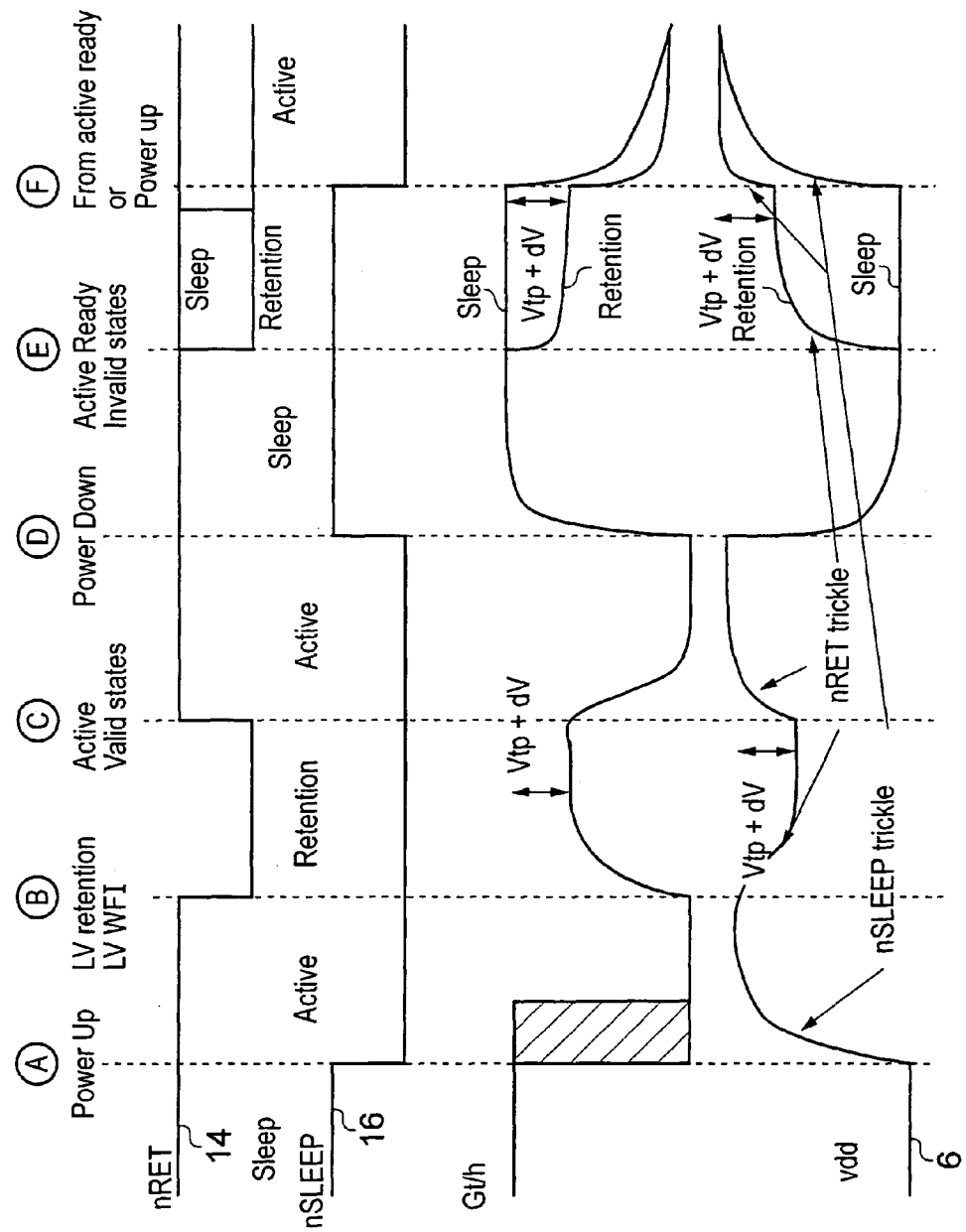
FIG. 3 is a signal diagram illustrating the variation in voltage levels with time in the example embodiment of FIGS. 1 and 2.

FIG. 3 shows a signal diagram depicting various state transitions within the power control apparatus 2 of FIG. 1. FIG. 3 shows how the retention select signal 14, the sleep select signal 16, the control voltage level at the signal node Gt, and the supply voltage VDD at the power output 6 vary with each transition.

At transition A of FIG. 3, the apparatus 2 switches from the sleep state to the active state. While the retention select signal 14 is at a high logic level, the sleep select signal 16 switches from a high logic level to a low logic level, causing the signal node Gt to drop to a low logic level. This causes switch device 8 to be turned on so that the power output 6 gradually rises to the input voltage level VDDG.

At transition B, the device switches to the retention mode when the retention select signal 14 switches from a high level to a low level. This causes the tri-state buffer 12 to isolate the switch device 8 from the sleep select signal, and at the same time switches the control device 10 on, thus connecting the gate and drain of the switch device 8 such that the switch device 8 to be placed in a diode-connected state.

The VDD voltage level was high at the time of transition B. By connecting the gate and drain of the switch device 8, the VDD voltage level is applied to the gate and this causes the switch device 8 to be turned off. Hence, the VDD voltage begins to drop. When the VDD voltage (and hence the gate voltage of the switch device 8) drops to VDDG−|Vtp| (where Vtp is the threshold voltage of the switch device), then the switch device begins to turn on again but is not yet passing enough current to overcome the static leakage current drawn by the associated circuit (while the static leakage of the associated circuit is reduced in the retention mode, there is still a leakage current). As the VDD level drops further, the current supplied by switch device 8 increases until an equilibrium state is reached in which the current supplied by the switch device 8 matches the retention leakage current drawn by the associated circuit.

The equilibrium is reached when the VDD level reaches VDDG−|Vtp|−dV (where dV is the gate drive beyond Vtp that is needed for the switch to supply enough current to match the retention leakage). Accordingly, in the retention mode a voltage drop of (|Vtp|+dV) is formed across the switch device 8 so that both the voltage level at node Gt and the output supply voltage VDD settle to a voltage level which is lower than the input voltage level by an amount dependent on the threshold voltage Vtp of the switch device 8. The reduced output voltage in the retention state is sufficient to maintain state values within the processing circuit.

Mathematically, the magnitude of dV can be derived from the equation for the drain-source current Ids passing through the switch device 8, which is given by:

$$Ids = \frac{\beta}{2}(Vgs - |Vtp|)^2 \tag{1}$$

where Vgs is the gate-source voltage difference, Vtp is the threshold voltage of the switch device, and β is a gain of the switch device 8.

Rearranging equation 1 gives:

$$Vgs = \sqrt{\left(\frac{2*Ids}{\beta}\right)} + |Vtp| \tag{2}$$

In the equilibrium state of the retention mode, the drain-source current Ids equals the retention leakage current $I_{leak@Vret}$ that is drawn by the associated circuit when supplied with the retention voltage Vret. Also, during the retention mode, the gate and drain of the switch device 8 are coupled together and so the drain-source voltage difference Vds is equal to the gate-source voltage difference Vgs. Therefore:

$$Vds = Vgs = \sqrt{\left(\frac{2*I_{leak@Vret}}{\beta}\right)} + |Vtp| \tag{3}$$

The retention voltage Vret equals VDDG−Vds. Hence:

$$Vret = VDDG - Vds = VDDG - \left(\sqrt{\left(\frac{2*I_{leak@Vret}}{\beta}\right)} + |Vtp|\right) \tag{4}$$

Therefore, Vret=VDDG−|Vtp|−dV, where $$dV = \sqrt{\left(\frac{2*I_{leak@Vret}}{\beta}\right)}.$$

Since the state values have been retained during the retention mode, then after transition C when the device returns to the active state the state values will continue to be valid within any flops and latches of the processing circuit. In transition C, the sleep select signal 16 maintains its low value while the retention select signal 14 switches to a high value, thus turning the control device 10 off and allowing the tri-state buffer 12 to pass the sleep select value 16 to the switch device 8. Thus, the switch device 8 again passes the full input voltage VDDG to the power output 6 and the signal node Gt drops to a low logic level.

In transition D, the sleep select signal 16 transitions to a high value to switch the switch device 8 to the sleep mode so that the processing circuit can be powered down. Thus, the power output 6 is isolated from the input voltage at the power input 4 and the voltage level VDD at the power output 6 discharges to ground. Any state within the processing circuit is then lost.

At transition E of FIG. 3, the switch device either continues in the sleep mode or returns to the retention mode (FIG. 3 showing the differing values of the retention select signal 14, and the node Gt and the output voltage VDD 6 representing the alternative cases where the sleep mode or retention mode is selected).

Since the device has recently been in the sleep mode then on transitioning to the retention mode the state within the processing circuit will initially be invalid until the flip-flops or latches within the processing circuit are updated with valid values. Nevertheless, it can be useful to switch to the retention mode from the sleep mode, so that the transition latency can be reduced when the device is subsequently switched to the active mode. The retention mode can be used in this way as a "pre-active" mode for switching to active mode with low transition latency.

At transition F, then the device returns to the active state once more.

Thus, FIG. 3 shows how the power control apparatus 2 can control the power supply to the processing circuit in any of the active, retention and sleep modes according to the needs of the processing circuit. For example, if the processing circuit is part of a mobile telephone, then the circuit may be supplied with power in the active mode while a telephone conversation is taking place or a game is being played, but may drop to the retention mode if the telephone is inactive for a period, in order to save power while maintaining processing state. If a phone call is then received, the retention mode enables a switch to the active mode to be performed with lower latency than when in the sleep mode. When the user switches the telephone off then the phone may be switched to the sleep mode.

Figure 4:
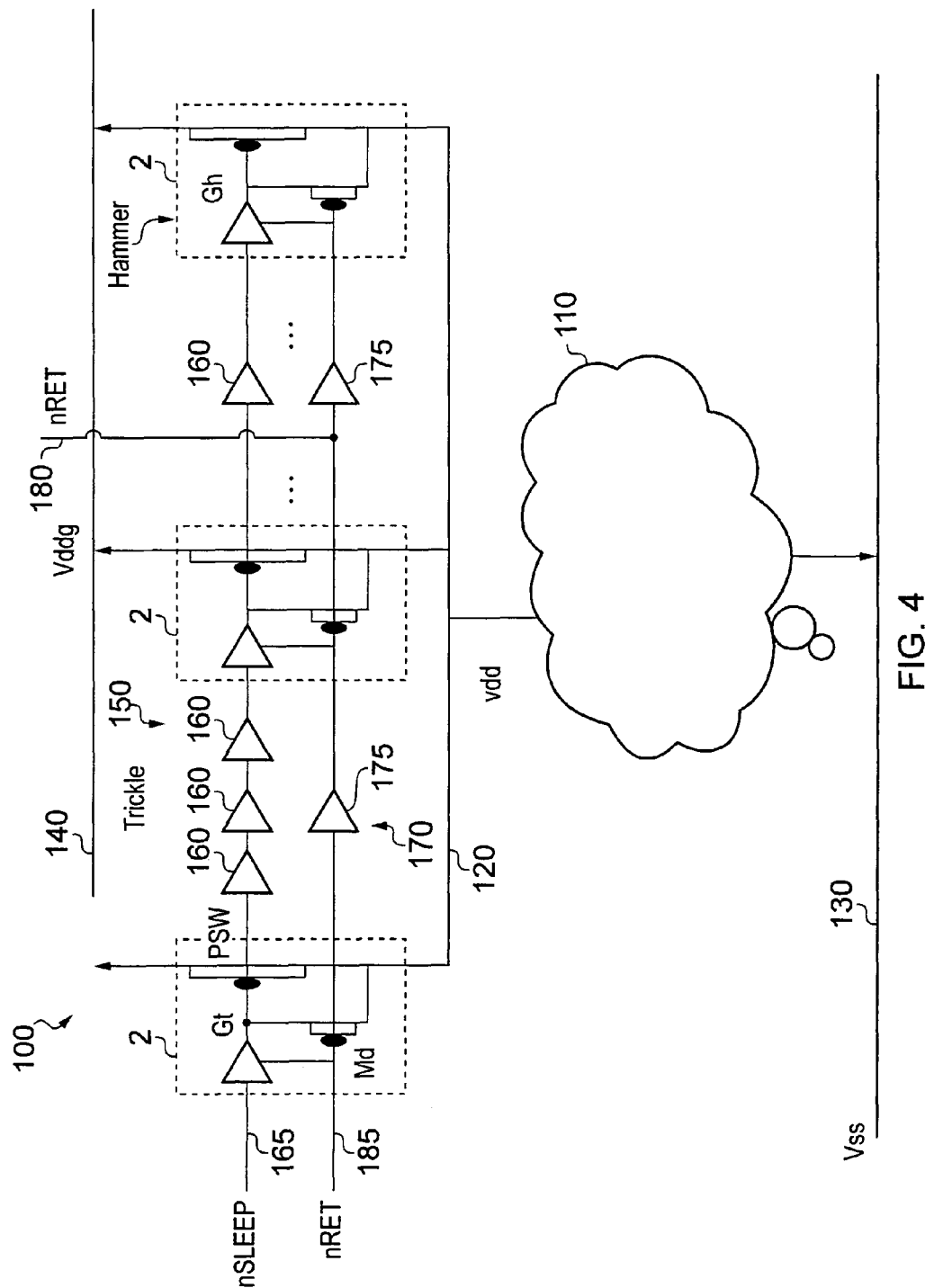
FIG. 4 illustrates a processing apparatus comprising a header circuit for controlling the supply voltage for a processing circuit.

FIG. 4 shows an example processing apparatus comprising a plurality of power control apparatuses 2 as shown in FIG. 1. The processing apparatus 100 comprises an associated circuit 110, which may be any kind of electronic circuit such as a processor, a memory, a cache, a register bank, a memory controller or cache controller, or other component of a processing apparatus, but in this particular example is a processing circuit. The processing circuit 110 is coupled between power rails 120, 130. Power rail 120 supplies a main supply voltage VDD to processing circuit 110, while the power rail 130 supplies a ground supply voltage VSS.

A number of header circuits 2 similar to the circuit shown in FIG. 1 are coupled between the main supply voltage rail 120 and an external supply voltage rail 140. The header circuits regulate the voltage level supplied to the processing circuit 110 via the supply rail 120 in accordance with the active, sleep and retention modes as described above.

The sleep select signal 16 is distributed to the different header circuits 2 via a sleep select supply network 150. The sleep select supply network 150 comprises a chain of delaying elements 160 which connect the various header circuits 2 so that the sleep select signal is supplied to the respective header circuits 2 at different times. The delaying elements 160 in this example comprise buffers but may in other embodiments comprise any other circuit element that adds a signal delay. The sleep select signal is inputted at the start 165 of the sleep signal select network 150 and then propagates through the respective header circuits 2 so that the sleep select signal is delivered to the header circuits 2 at different times depending on the delay provided between each circuit.

Similarly, a retention select supply network 170 is provided to distribute the retention enable signal 14 to the respective header circuits 2. Again, the retention select supply network comprises a chain of delaying elements 175 which ensure that the retention enable signal is supplied to the respective header circuits 2 at different times. By staggering the provision of the sleep select signal and retention select signal to the respective header circuits 2, a high in-rush current can be avoided and a voltage drop in the processing circuit 110 reduced.

The retention select supply network 170 may comprise a bypass input 180 for inputting the retention select signal 14 at a mid-point of the retention select supply chain 170. The bypass input can be used on transitions from the retention mode to the active mode, when the in-rush current will not be as large as on transitions from the sleep mode to the active mode because of the reduced voltage difference between the retention voltage and the active supplying voltage. Thus, by inputting the retention select signal at a mid-point of the supply chain (as well as optionally at an initial input 185 of the supply chain if desired), the latency associated with supplying the retention and enable signal to all of the header circuits 2 including the hammer (the final header circuit 2) is reduced.

While only three header circuits 2 are illustrated in FIG. 4 for clarity and conciseness, it will be appreciated that more or fewer header circuits 2 may be provided in the processing apparatus 100. The bypass input 180 in the retention select supply network 170 need not be the exact halfway point of the supply chain and may be at any intermediate point.

Thus, by providing the header circuits 2 in the processing apparatus 100, then various power saving modes can be implemented to reduce the voltage difference across the processing circuit 110 and hence reduce static leakage. This can be useful in mobile apparatuses, for example, to prolong battery lifetime.

Figure 5:
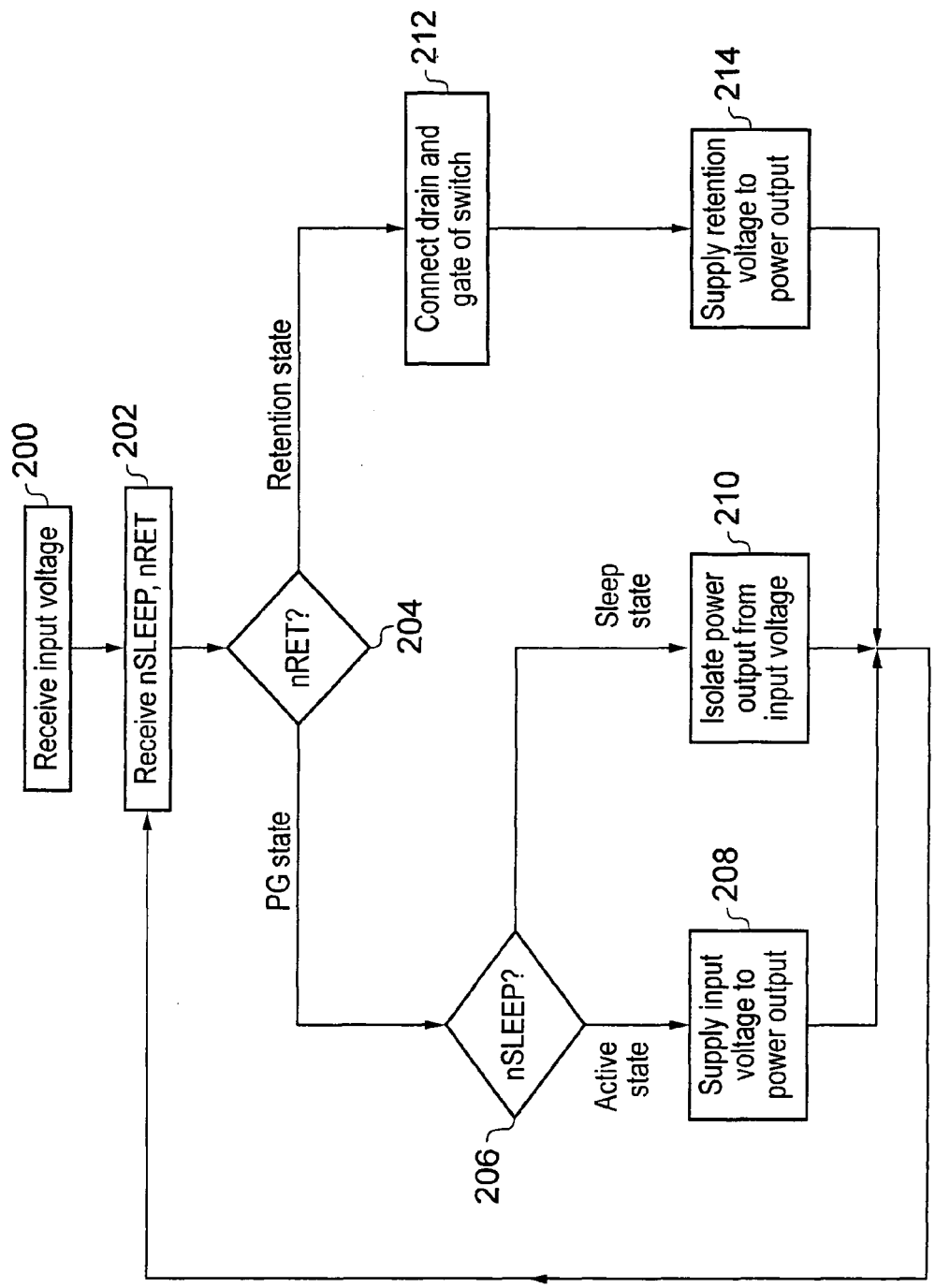
FIG. 5 illustrates a method of controlling a power supply to a processing circuit.

FIG. 5 illustrates a method for controlling the power supply to a processing circuit 110 using a header circuit of the type described above. At step 200 the input voltage is received at the power input 4 of the header circuit 2. At step 202 the sleep select signal 16 and retention select signal 14 are received.

At step 204, the value of the retention select signal is determined. If the retention select signal has the power gating state (in the example FIG. 2, the high voltage state) then the method proceeds to step 206 where the value of the sleep select signal is determined. If the sleep select signal is in the active state (in FIG. 2, the low voltage state) then at step 208 the switch device 8 is turned on so as to supply the input voltage to the power output 6. If the sleep select signal 16 is in the sleep state (in FIG. 2, the high voltage state) then at step 210 the switch device 8 is turned off to isolate the power output 6 from the input voltage.

If at step 204 the retention select signal was in the retention state (in FIG. 2, the low voltage level state), then at step 212 of FIG. 5 the control device 10 is turned on so as to connect the drain and gate of the switch device 8. This causes the switch device 8 to operate in a diode connected mode in which a voltage drop dependent on the threshold voltage of the switch device 8 arises across the switch device 8, so that the retention voltage which is lower than the input voltage is supplied to the power output 6 at step 214.

The method of FIG. 5 then continues back to step 202 where the values of the sleep select signal 16 and the retention select signal 14 are again received. By adjusting the levels of the signals then the power supply voltage to the processing circuit can be adjusted to be in the active, retention or sleep states.

Figure 6:
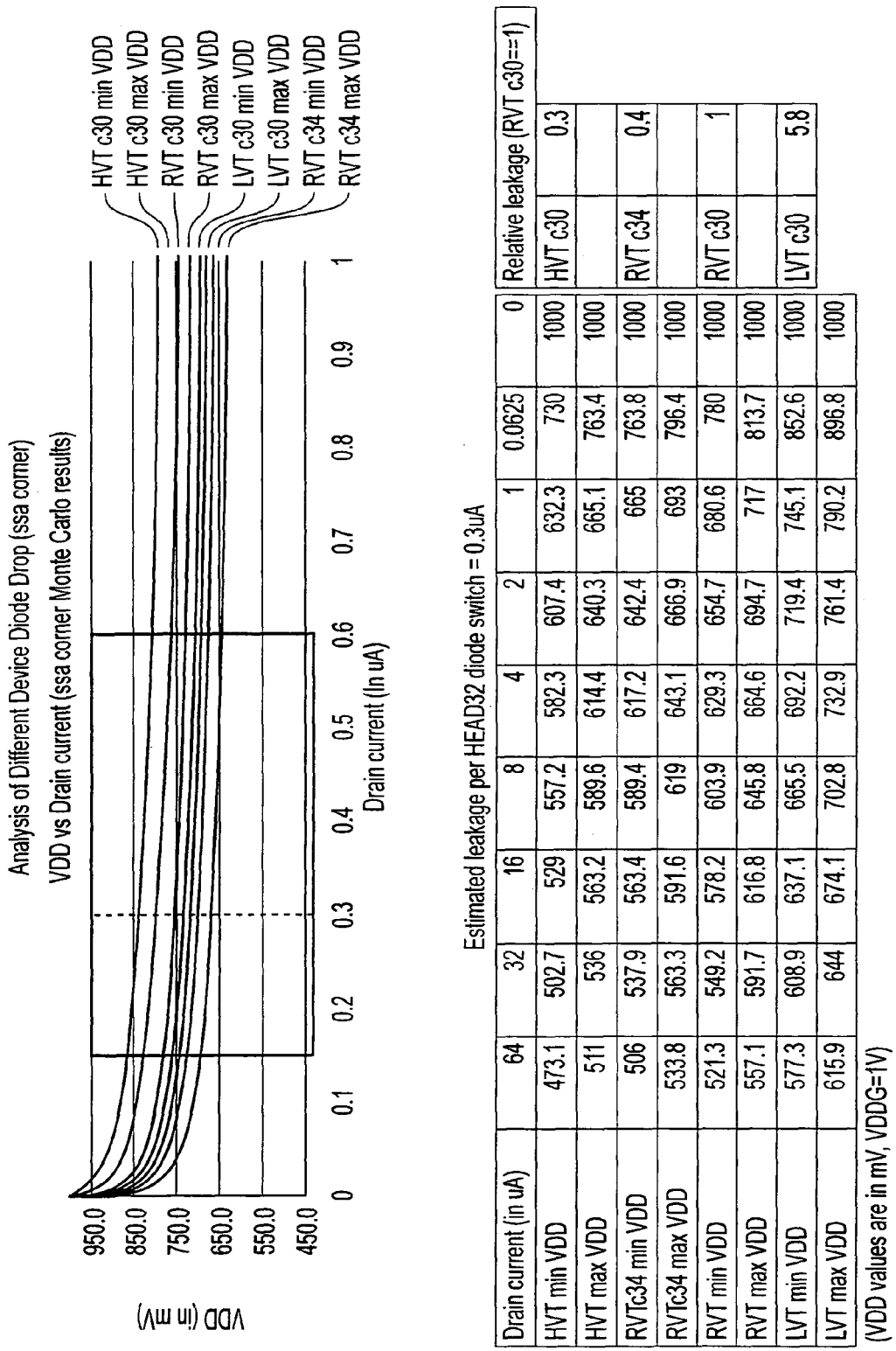
FIG. 6 illustrates the results of simulating the voltage drop across the switch device during the retention mode.

FIG. 6 illustrates some results of Monte Carlo simulations which model the expected voltage drop across the switch device 8 during the retention mode. The graphs and tables of FIG. 6 show expected retention voltages in mV for different process corners and across multi-channel switches. It can be seen from the graphs and tables shown in FIG. 6 that in most cases the retention voltage is expected to stay above 550 mV, which is believed to be sufficient to retain processing state within a processing circuit.

Figures 7, 8:
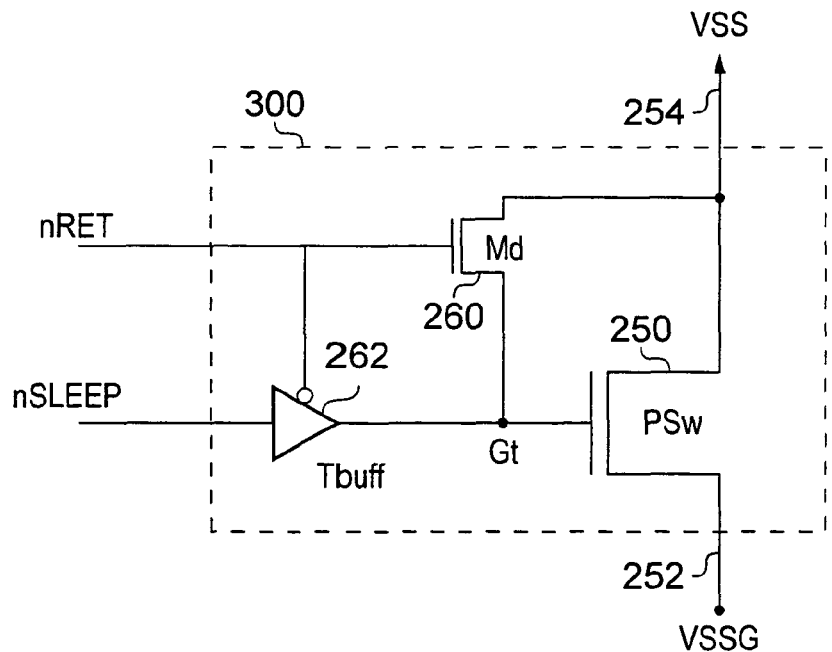
FIG. 7 shows an embodiment of a power control apparatus for controlling a ground supply voltage to a processing circuit.
FIG. 8 shows example control signals for controlling the various operating modes of the apparatus of FIG. 7.

FIG. 7 shows an alternative embodiment of a power control apparatus. In FIG. 7 a footer apparatus 300 is provided for controlling the ground supply voltage VSS to the processing circuit. The footer circuit is constructed in a similar way to the header circuit 2 of FIG. 1, except that the footer circuit 300 is constructed using n-type transistors instead of p-type transistors. A switch device 250 is coupled between a power input 252 and a power output 254 for supplying the ground supply voltage VSS to the processing circuit. A control device 260 and tri-state buffer 262 control the operating mode of the switch device 250 in response to a retention select signal and sleep select signal. FIG. 8 shows how the signals within the footer circuit 300 vary when different values of the retention enable signal and sleep select signal are provided to the footer circuit 300. The switch device 250 of the footer circuit 300 can be controlled to be placed in the active, retention and sleep modes in a similar way to the header circuit of FIG. 1. In the retention mode, the switch device 250 is diode connected so that a voltage rise across the switch device is formed so as to increase the ground supply voltage supplied to the processing circuit. When the footer circuit 300 is used to supply a ground supply voltage to a processing circuit 110 as shown in the example of FIG. 9, then the retention mode enables the voltage difference across the processing circuit 110 to be reduced as the ground supply voltage VSS is raised to be closer to the main supply voltage VDD.

Figure 9:
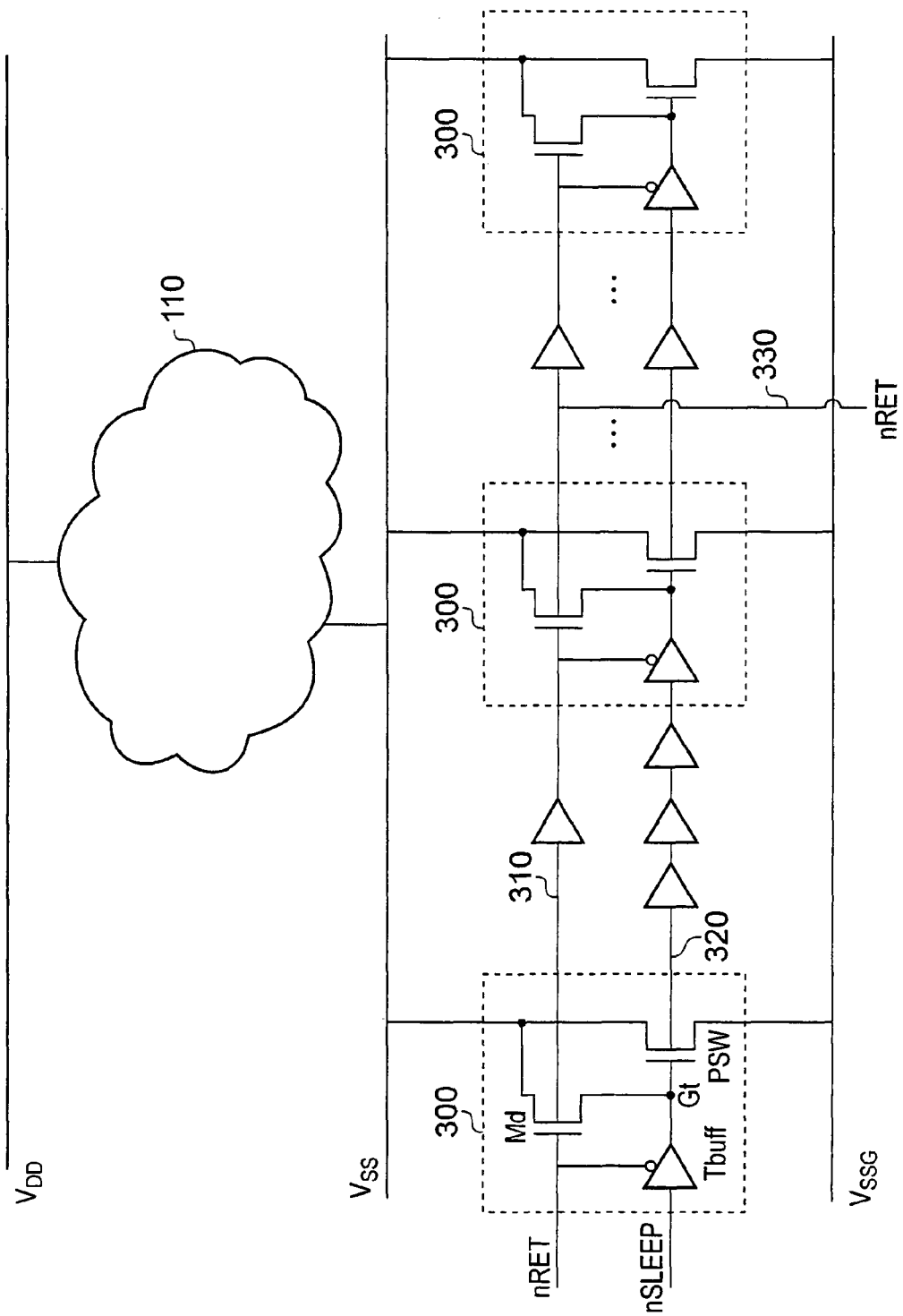
FIG. 9 shows a processing apparatus having a footer circuit for controlling the ground supply level for a processing circuit.

As in the header embodiment of FIG. 4, the footer embodiment of FIG. 9 comprises a retention select supply network 310 and a sleep select supply network 320 for trickling the retention select signal and sleep select signal to the various footer circuits 300 within the processing apparatus. Again, the retention select supply network 210 comprises a bypass input 330 which can be used to supply the retention select signal at a mid-point of the supply chain when transitioning from the retention mode to the active mode.

It will be appreciated that the above embodiments are illustrative embodiments only and that alternative arrangements of the power control apparatus may be provided. For example, a p-type footer circuit or an n-type header circuit may be devised by the skilled person.

Also, while FIGS. 1 and 7 show the control voltage (VDDG−|Vtp|−dV) or (VSSG+Vtn+dV) for selecting the retention mode of the switch device being applied to the control terminal by coupling the gate and drain of the switch device, the switch device may also be placed in the retention mode by devising a different circuit for applying such a control voltage to the control terminal.

Although illustrative embodiments of the invention have been described in detail herein with reference to the accompanying drawings, it is to be understood that the invention is not limited to those precise embodiments and that various changes and modifications may be made by one skilled in the art without departing from the scope and spirit of the invention as defined by the appended claims.

We claim:

1. A power control apparatus for controlling a supply voltage for an associated circuit, comprising:
    a power input for receiving an input voltage;
    a power output for supplying said supply voltage to said associated circuit;
    a switch device comprising a first terminal coupled to said power input, a second terminal coupled to said power output, and a control terminal for receiving a sleep select signal;
    a control device for selectively connecting said second terminal of said switch device to said control terminal of said switch device, wherein when said second terminal and said control terminal are not connected by said control device, said switch device is responsive to said sleep select signal to select whether or not to supply said input voltage to said power output; and when said second terminal and said control terminal are connected by said control device, a voltage difference is formed between said power input and said power output and said switch device supplies a retention voltage to said power output, said retention voltage being different to said input voltage; and
    a tristate buffer coupled to said control terminal of said switch device and configured to:
        isolate said control terminal of said switch device from said sleep select signal when said second terminal is connected to said control terminal by said control device; and
        allow said sleep select signal to be supplied to said control terminal of said switch device when said second terminal is not connected to said control terminal by said control device.

2. The power control apparatus according to claim 1, wherein said switch device has a plurality of operating modes including:
    (i) an active mode in which said second terminal and said control terminal are not connected by said control device and said sleep select signal controls said switch device to supply said input voltage to said power output;
    (ii) a sleep mode in which said second terminal and said control terminal are not connected by said control device and said sleep select signal controls said switch device to isolate said power output from said input voltage;
    (iii) a retention mode in which said second terminal and said control terminal are connected by said control device and said switch device supplies said retention voltage to said power output.

3. The power control apparatus according to claim 1, wherein said power control apparatus is a footer circuit.

4. The power control apparatus according to claim 3, wherein said switch device is an n-type transistor.

5. The power control apparatus according to claim 3, wherein said retention voltage is higher than said input voltage.

6. The power control apparatus according to claim 1, wherein said power control apparatus is a header circuit.

7. The power control apparatus according to claim 6, wherein said switch device is a p-type transistor.

8. The power control apparatus according to claim 6, wherein said retention voltage is lower than said input voltage.

9. The power control apparatus according to claim 1, wherein said control device is responsive to a retention select signal to select whether said second terminal is connected to said control terminal; and
    said tristate buffer is responsive to said retention select signal to select whether to allow said sleep select signal to be supplied to said control terminal of said switch device.

10. The power control apparatus according to claim 1, wherein when said second terminal and said control terminal of said switch device are connected by said control device, said voltage difference is dependent on a threshold voltage of said switch device.

11. A data processing apparatus comprising:
    said associated circuit; and
    at least one power control apparatus according to claim 1 for controlling a supply voltage for said associated circuit.

12. The data processing apparatus according to claim 11, comprising a plurality of said power control apparatuses; and
    a sleep select supply network for supplying said sleep select signal to said plurality of power control apparatuses;
    wherein said sleep select supply network comprises at least one delaying element for delaying said sleep select signal for one of said power control apparatuses relative to said sleep select signal for another of said power control apparatuses.

13. The data processing apparatus according to claim 11, wherein when said retention voltage is supplied to said associated circuit by said at least one power control apparatus, a voltage difference across said associated circuit is smaller than when said input voltage is supplied to said associated circuit by said at least one power control apparatus.

14. The data processing apparatus according to claim 11, wherein said control device is responsive to a retention select signal to select whether said second terminal is connected to said control terminal; and said data processing apparatus comprises a plurality of said power control apparatuses and a retention select supply network for supplying said retention select signal to said plurality of power control apparatuses;

wherein said retention select supply network comprises at least one delaying element for delaying said retention select signal for one of said power control apparatuses relative to said retention select signal for another of said power control apparatuses.

15. The data processing apparatus according to claim 14, wherein said retention select supply network comprises a chain of said delaying elements for delaying said retention select signals for respective power control apparatuses by respective delay amounts;

said chain of delaying elements comprising a start input for inputting said retention select signal at a start of said chain and a bypass input for inputting said retention select signal at an intermediate point of said chain;

wherein said retention select signal is input at said bypass input when said switch devices of said power control apparatuses transition from supplying said retention voltage to supplying said input voltage.

16. A power control apparatus for controlling a supply voltage for an associated circuit, comprising:

power input means for receiving an input voltage;

power output means for supplying said supply voltage to said associated circuit;

switch means for switching said supply voltage, comprising a first terminal means for coupling to said power input means, a second terminal means for coupling to said power output means, and a control terminal means for receiving a sleep select signal;

control means for selectively connecting said second terminal means of said switch means to said control terminal means of said switch means; wherein when said second terminal means and said control terminal means are not connected by said control means, said switch means is responsive to said sleep select signal to select whether or not to supply said input voltage to said power output means; and when said second terminal means and said control terminal means are connected by said control means, a voltage difference is formed between said power input means and said power output means and said switch means supplies a retention voltage to said power output means, said retention voltage being different to said input voltage; and tristate buffer means coupled to said control terminal means of said switch means for:

isolating said control terminal means of said switch means from said sleep select signal when said second terminal means is connected to said control terminal means by said control means; and allowing said sleep select signal to be supplied to said control terminal means of said switch means when said second terminal means is not connected to said control terminal means by said control means.

17. A method of controlling a supply voltage for an associated circuit using a switch device comprising a control terminal, a first terminal coupled to a power input, and a second terminal coupled to a power output for supplying said supply voltage to said associated circuit;

said method comprising:

receiving an input voltage at said first terminal;

receiving a control signal at said control terminal;

when said control signal has a first voltage level, operating said switch device in an active mode in which said switch device supplies said input voltage to said power output;

when said control signal has a second voltage level, operating said switch device in a retention mode in which a voltage difference is formed between said power input and said power output and said switch device supplies a retention voltage to said power output, said retention voltage being different to said input voltage; and when said control signal has a third voltage level, operating said switch device in a sleep mode in which said switch device isolates said power output from said input voltage.

18. A method of controlling a supply voltage for an associated circuit using a switch device comprising a control terminal, a first terminal coupled to a power input, and a second terminal coupled to a power output for supplying said supply voltage to said associated circuit, and a tristate buffer coupled to said control terminal of said switch device, said method comprising:

receiving an input voltage at said power input;

selectively connecting said second terminal of said switch device to said control terminal of said switch device;

when said second terminal and said control terminal are not connected, selecting whether or not to supply said input voltage to said power output in dependence on a sleep select signal received at said control terminal;

when said second terminal and said control terminal are connected, forming a voltage difference between said power input and said power output and supplying a retention voltage to said power output, said retention voltage being different to said input voltage;

isolating said control terminal of said switch device from said sleep select signal when said second terminal is connected to said control terminal by said control device; and allowing said sleep select signal to be supplied to said control terminal of said switch device when said second terminal is not connected to said control terminal by said control device.

19. A power control apparatus for controlling a supply voltage for an associated circuit, comprising:

a power input for receiving an input voltage;

a power output for supplying said supply voltage to said associated circuit;

a switch device for controlling said supply voltage, comprising a first terminal coupled to said power input, a second terminal coupled to said power output, and a control terminal for receiving a control signal; wherein:

said switch device is responsive to said control signal having a first voltage level to operate in an active mode in which said switch device supplies said input voltage to said power output;

said switch device is responsive to said control signal having a second voltage level to operate in a retention mode in which a voltage difference is formed between said power input and said power output and said switch device supplies a retention voltage to said power output, said retention voltage being different to said input voltage; and said switch device is responsive to said control signal having a third voltage level to operate in a sleep mode in which said switch device isolates said power output from said input voltage.

20. A power control apparatus for controlling a supply voltage for an associated circuit, comprising:

power input means for receiving an input voltage;

power output means for supplying said supply voltage to said associated circuit;

switch means for controlling said supply voltage, comprising a first terminal means for coupling to said power input means, a second terminal means for coupling to said power output means, and a control terminal means for receiving a control signal; wherein:

said switch device means is responsive to said control signal having a first voltage level to operate in an active mode in which said switch device means supplies said input voltage to said power output means;

said switch device means is responsive to said control signal having a second voltage level to operate in a retention mode in which a voltage difference is formed between said power input means and said power output means and said switch device supplies a retention voltage to said power output means, said retention voltage being different to said input voltage; and said switch device means is responsive to said control signal having a third voltage level to operate in a sleep mode in which said switch device means isolates said power output means from said input voltage.

* * * * *